US011268805B2

(12) United States Patent
Sasaki

(10) Patent No.: US 11,268,805 B2
(45) Date of Patent: Mar. 8, 2022

(54) MEASUREMENT METHOD

(71) Applicant: KIOXIA CORPORATION, Tokyo (JP)

(72) Inventor: Kaori Sasaki, Yokkaichi Mie (JP)

(73) Assignee: Kioxia Corporation, Tokyo (JP)

(*) Notice: Subject to any disclaimer, the term of this patent is extended or adjusted under 35 U.S.C. 154(b) by 261 days.

(21) Appl. No.: 16/523,435

(22) Filed: Jul. 26, 2019

(65) Prior Publication Data

US 2020/0256663 A1 Aug. 13, 2020

(30) Foreign Application Priority Data

Feb. 13, 2019 (JP) ............................ JP2019-023722

(51) Int. Cl.
*G01B 11/02* (2006.01)
*G06N 20/00* (2019.01)
*H01L 21/66* (2006.01)

(52) U.S. Cl.
CPC ............ *G01B 11/02* (2013.01); *G06N 20/00* (2019.01); *H01L 22/12* (2013.01)

(58) Field of Classification Search
CPC ...................................................... G01B 11/02
USPC .......................................................... 702/172
See application file for complete search history.

(56) References Cited

U.S. PATENT DOCUMENTS

2004/0176928 A1* 9/2004 Johnson ............. G01N 21/8851 702/182
2004/0267397 A1 12/2004 Doddi
2018/0182632 A1* 6/2018 Feng ................. H01J 37/32963
2019/0219380 A1* 7/2019 Quaedackers ........ G06T 3/4038

FOREIGN PATENT DOCUMENTS

JP 4589315 B2 12/2010

* cited by examiner

*Primary Examiner* — Ricky Go
(74) *Attorney, Agent, or Firm* — Foley & Lardner LLP

(57) ABSTRACT

According to one embodiment, a diffraction signal of each of a plurality of reference structures provided on a substrate is acquired. The diffraction signals are classified based on a similarity to generate a first data map. The diffraction signals in the first data map are used to interpolate data between the diffraction signals to generate a first interpolation data map. An actual dimension of each of the plurality of reference structures is measured. The actual dimensions are arranged to correspond to the diffraction signals of the first data map to generate a second data map. The actual dimensions in the second data map are used to interpolate data between the actual dimensions to generate a second interpolation data map. The first interpolation data map and the second interpolation data map are used to derive a calculation formula by which the actual dimension is obtained from the diffraction signal.

10 Claims, 10 Drawing Sheets

START
S10 IRRADIATE SAMPLE STRUCTURE WITH LIGHT BEAM AND ACQUIRE DIFFRACTION SIGNAL (LEARNING DATA)
S20 INTERPOLATE DATA BETWEEN DIFFRACTION SIGNALS AND GENERATE INTERPOLATION LEARNING DATA MAP
S30 ACQUIRE ACTUAL DIMENSION OF SAMPLE STRUCTURE (TRAINING DATA)
S40 GENERATE TRAINING DATA MAP
S50 INTERPOLATE DATA BETWEEN ACTUAL DIMENSIONS AND GENERATE INTERPOLATION TRAINING DATA MAP
S60 DERIVE FORMULA 1 USING INTERPOLATION LEARNING DATA MAP AND INTERPOLATION TRAINING DATA MAP
S70 MEASURE DIFFRACTION SIGNAL OF TARGET STRUCTURE AND CALCULATE LS
END 1
90
80
60
50
40
30
20
10
70
L
P
W
LS

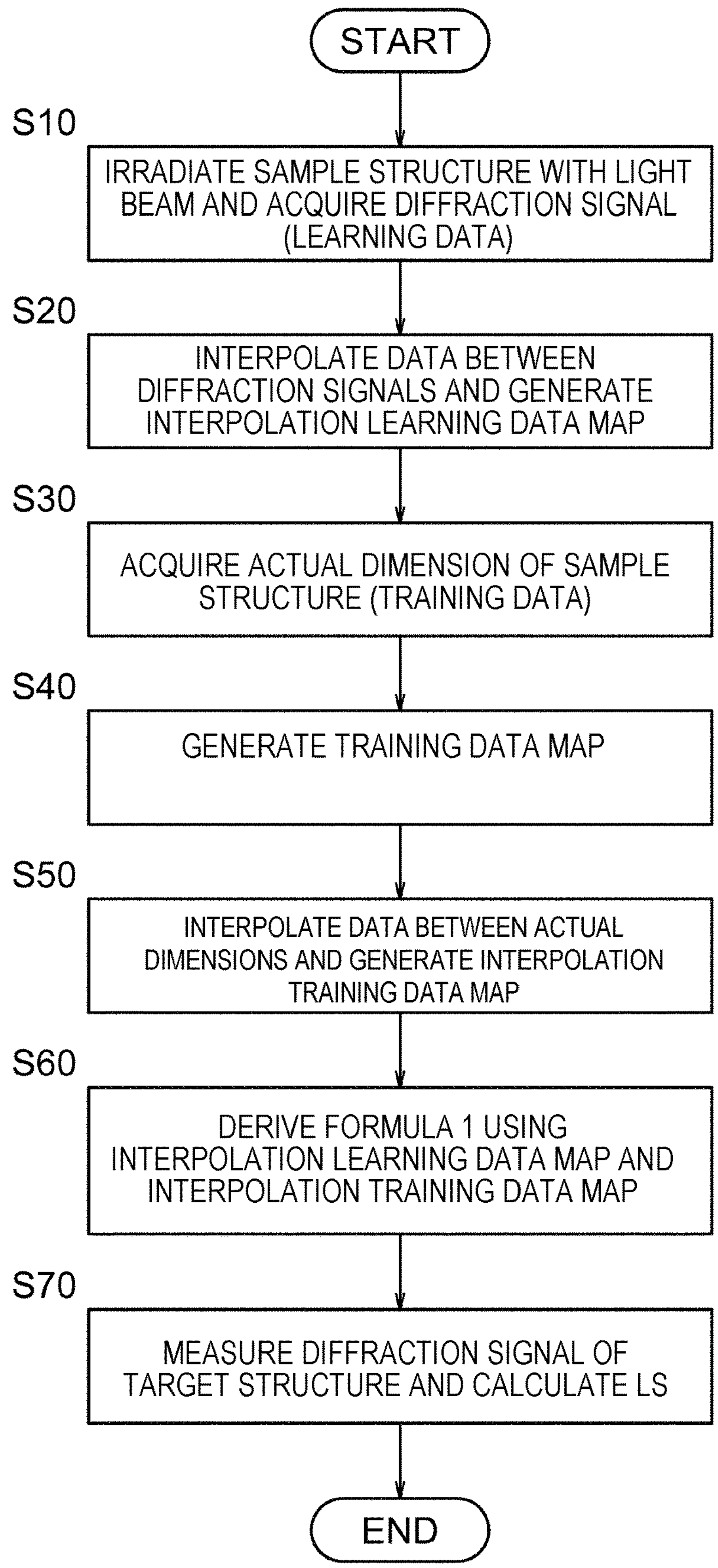
FIG. 2
START
S10
IRRADIATE SAMPLE STRUCTURE WITH LIGHT BEAM AND ACQUIRE DIFFRACTION SIGNAL (LEARNING DATA)
S20
INTERPOLATE DATA BETWEEN DIFFRACTION SIGNALS AND GENERATE INTERPOLATION LEARNING DATA MAP
S30
ACQUIRE ACTUAL DIMENSION OF SAMPLE STRUCTURE (TRAINING DATA)
S40
GENERATE TRAINING DATA MAP
S50
INTERPOLATE DATA BETWEEN ACTUAL DIMENSIONS AND GENERATE INTERPOLATION TRAINING DATA MAP
S60
DERIVE FORMULA 1 USING INTERPOLATION LEARNING DATA MAP AND INTERPOLATION TRAINING DATA MAP
S70
MEASURE DIFFRACTION SIGNAL OF TARGET STRUCTURE AND CALCULATE LS
END INTERPOLATION LEARNING DATA MAP
(ACTUALLY MEASURED ANALYTIC SIGNALS AND INTERPOLATED DATA)

ACTUAL DIMENSION (TRAINING DATA)

| SAMPLE No. | ACTUAL DIMENSION |
|---|---|
| S1 | 5.5 |
| S2 | 4.8 |
| S3 | 4.6 |
| ... | ... |

ASSOCIATED

LEARNING DATA MAP

SECTION WITH NO DIFFRACTION SIGNAL

FIG. 7

TRAINING DATA MAP

| | | | | | | |
|---|---|---|---|---|---|---|
| | | | | | | |
| | | 5.5 | 6.3 | | | |
| | 3.8 | 3.9 | 3.9 | 3.9 | 3.6 | |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| | 3.1 | | 7.4 | 6.4 | 4.6 | 4.0 |

SECTION WITH NO DIFFRACTION SIGNAL

FIG. 8

INTERPOLATION TRAINING DATA MAP

| | | | | | | |
|---|---|---|---|---|---|---|
| 4.4 | 4.8 | 5.4 | 5.5 | 5.0 | 4.3 | 3.9 |
| 4.0 | 4.3 | 5.5 | 6.3 | 4.5 | 3.9 | 3.6 |
| 3.9 | 3.8 | 3.9 | 3.9 | 3.9 | 3.6 | 3.3 |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| 3.3 | 3.1 | 5.7 | 7.4 | 6.4 | 4.6 | 4.0 |

FIG. 9

TRAINING DATA MAP

| | | | | | | |
|---|---|---|---|---|---|---|
| (0) | (1) | (2) | (2) | (1) | (0) | (0) |
| (1) | (3) | 5.5 | 6.3 | (4) | (2) | (1) |
| (3) | 3.8 | 3.9 | 3.9 | 3.9 | 3.6 | (3) |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| (3) | 3.1 | (5) | 7.4 | 6.4 | 4.6 | 4.0 |

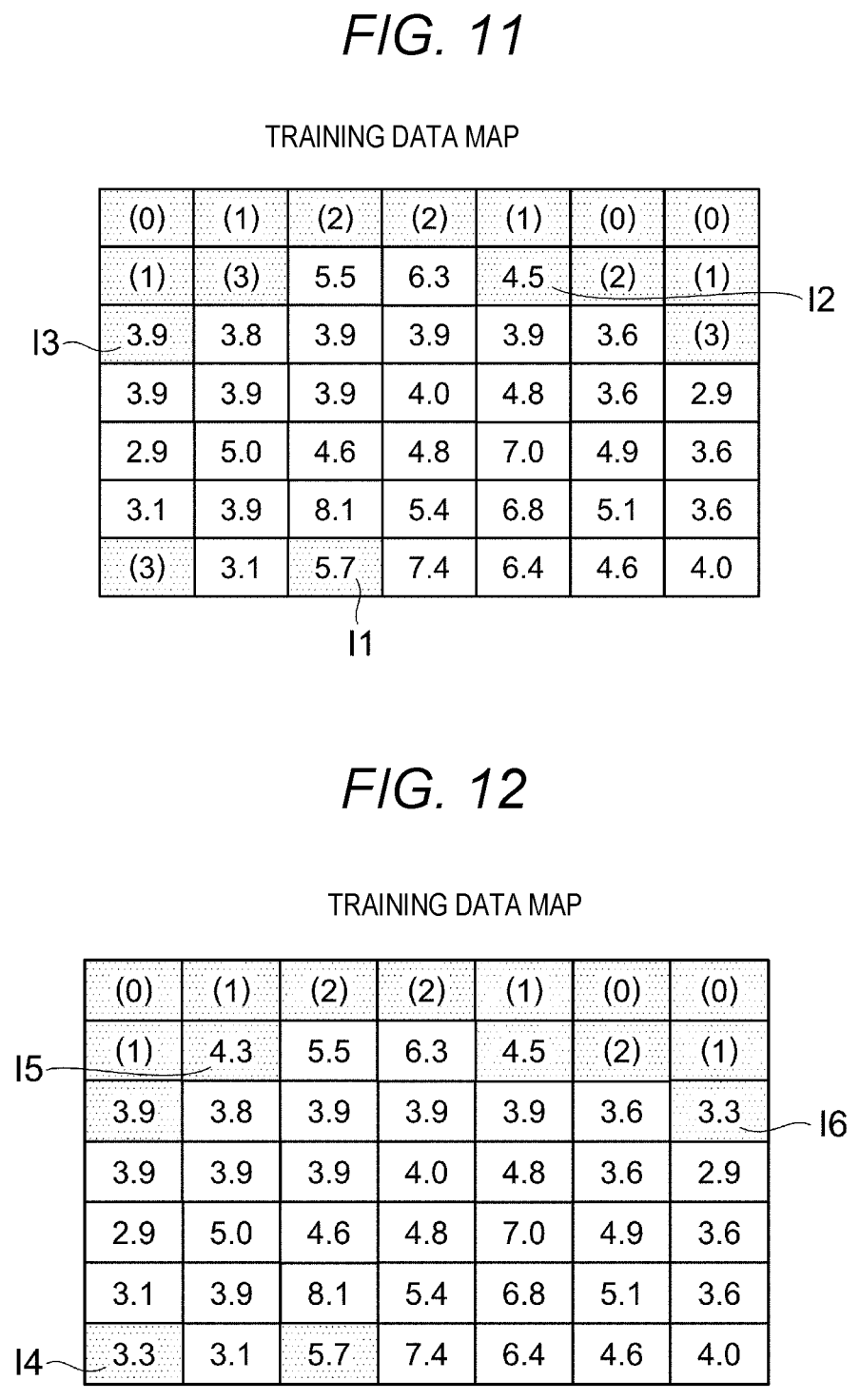

TRAINING DATA MAP

| (0) | (1) | (2) | (2) | (1) | (0) | (0) |
|---|---|---|---|---|---|---|
| (1) | (3) | 5.5 | 6.3 | 4.5 | (2) | (1) |
| 3.9 | 3.8 | 3.9 | 3.9 | 3.9 | 3.6 | (3) |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| (3) | 3.1 | 5.7 | 7.4 | 6.4 | 4.6 | 4.0 |

FIG. 12

TRAINING DATA MAP

| (0) | (1) | (2) | (2) | (1) | (0) | (0) |
|---|---|---|---|---|---|---|
| (1) | 4.3 | 5.5 | 6.3 | 4.5 | (2) | (1) |
| 3.9 | 3.8 | 3.9 | 3.9 | 3.9 | 3.6 | 3.3 |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| 3.3 | 3.1 | 5.7 | 7.4 | 6.4 | 4.6 | 4.0 |

*FIG. 13*

TRAINING DATA MAP 17 18 19

| | | | | | | |
|---|---|---|---|---|---|---|
| (0) | (1) | 5.4 | 5.5 | (1) | (0) | (0) |
| (1) | 4.3 | 5.5 | 6.3 | 4.5 | 3.9 | (1) |
| 3.9 | 3.8 | 3.9 | 3.9 | 3.9 | 3.6 | 3.3 |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| 3.3 | 3.1 | 5.7 | 7.4 | 6.4 | 4.6 | 4.0 |

FIG. 14

INTERPOLATION TRAINING DATA MAP

I14 I11 I12 I15 I16 I10 I13

| | | | | | | |
|---|---|---|---|---|---|---|
| 4.4 | 4.8 | 5.4 | 5.5 | 5.0 | 4.3 | 3.9 |
| 4.0 | 4.3 | 5.5 | 6.3 | 4.5 | 3.9 | 3.6 |
| 3.9 | 3.8 | 3.9 | 3.9 | 3.9 | 3.6 | 3.3 |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| 3.3 | 3.1 | 5.7 | 7.4 | 6.4 | 4.6 | 4.0 |

FIG. 15

INTERPOLATION TEACHING DATA MAP

| | | | | | | |
|---|---|---|---|---|---|---|
| — | — | — | — | — | — | — |
| — | 4.3 | 5.5 | 6.3 | 4.5 | 3.9 | — |
| 3.9 | 3.8 | 3.9 | 3.9 | 3.9 | 3.6 | 3.3 |
| 3.9 | 3.9 | 3.9 | 4.0 | 4.8 | 3.6 | 2.9 |
| 2.9 | 5.0 | 4.6 | 4.8 | 7.0 | 4.9 | 3.6 |
| 3.1 | 3.9 | 8.1 | 5.4 | 6.8 | 5.1 | 3.6 |
| 3.3 | 3.1 | 5.7 | 7.4 | 6.4 | 4.6 | 4.0 |

MEASUREMENT METHOD

CROSS-REFERENCE TO RELATED APPLICATION(S)

This application is based upon and claims the benefit of priority from Japanese Patent Application No. 2019-023722, filed Feb. 13, 2019, the entire contents of which are incorporated herein by reference.

FIELD

Embodiments described herein relate generally to a measurement method.

BACKGROUND

When optically measuring the dimension of a fine structure provided on a semiconductor substrate, an optical measurement device irradiates the structure with a light beam, and measures a diffracted light generated by the structure. The optical measurement device obtains a shape and the dimension of the structure by analyzing the diffracted light. In such a dimension measurement method, there is a technique (chemometrics technique) in which a corresponding relationship between a dimension value (training data) obtained by actually measuring a sample with an SEM (Scanning Electron Microscope) or the like and a diffraction spectrum (learning data) obtained by optical measurement is obtained in advance, and the dimension value is derived from the diffraction spectrum of a structure to be measured based on the corresponding relationship.

However, the training data needs to be measured by the SEM or the like after cleaving the semiconductor substrate, and it is difficult to perform a non-destructive measurement. Therefore, the number of samples of the training data is limited, and an accuracy of the dimension measurement is low.

Examples of related art include Japanese Patent No. 4589315.

DESCRIPTION OF THE DRAWINGS

FIG. 2 is a flowchart showing an example of a measurement method according to the first embodiment.

FIG. 7 is a conceptual diagram showing a flow from the actual dimension of the sample structure to generation of the interpolation training data map.

FIG. 8 is a conceptual diagram showing the flow from the actual dimension of the sample structure to generation of the interpolation training data map.

FIG. 9 is a conceptual diagram showing an interpolation processing method of a training data map.

FIG. 11 is a conceptual diagram showing the interpolation processing method of the training data map.

FIG. 12 is a conceptual diagram showing the interpolation processing method of the training data map.

FIG. 13 is a diagram showing the training data map after interpolation of interpolation target points following FIG. 12.

FIG. 14 is a diagram showing the interpolation training data map.

FIG. 15 is a conceptual diagram showing an interpolation training data map according to a second embodiment.

DETAILED DESCRIPTION

Figure 1:
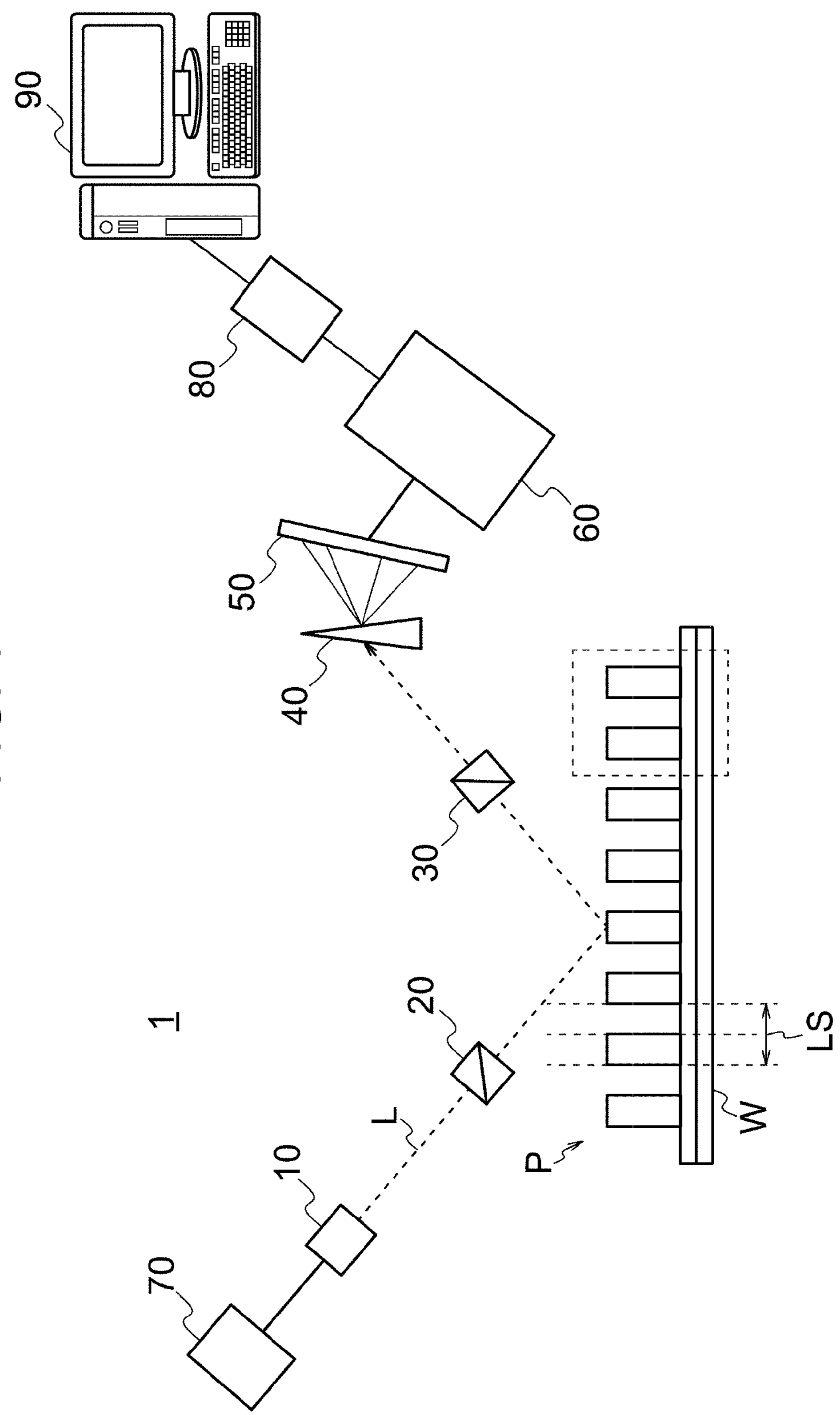
FIG. 1 is a diagram illustrating a configuration example of a dimension measurement device according to a first embodiment.

Embodiments provide a measurement method capable of optically measuring the dimension of a structure provided on a semiconductor substrate with high accuracy.

According to one embodiment, the measurement method acquires a diffraction signal of each of a plurality of reference structures provided on a substrate. The diffraction signals are classified based on a similarity to generate a first data map. The diffraction signals in the first data map are used to interpolate data between the diffraction signals to generate a first interpolation data map. An actual dimension of each of the plurality of reference structures is measured. The actual dimensions are arranged to correspond to the diffraction signals in the first data map so as to generate a second data map. The actual dimensions in the second data map are used to interpolate data between the actual dimensions to generate a second interpolation data map. The first interpolation data map and the second interpolation data map are used to derive a calculation formula by which the actual dimension is obtained from the diffraction signal.

Embodiments of the present disclosure will be described below with reference to the drawings. The embodiment is not intended to limit the present disclosure. The drawings are schematic or conceptual, and a ratio of each portion or the like is not necessarily the same as an actual one. In the specification and drawings, a detailed description denoted by the same reference numerals of the same elements as those described above with reference to the drawings is omitted as appropriate.

First Embodiment

FIG. 1 is a diagram illustrating a configuration example of a dimension measurement device according to a first embodiment. A dimension measurement device (hereinafter, simply referred to as "measurement device") 1 may be, for example, a Critical Dimension (CD) measurement device which measures a line width, a space width, and a film thickness or the like of a periodic structure formed on a semiconductor substrate W.

A periodic structure P formed on the semiconductor substrate W is, for example, a structure having a line pattern and a space pattern which are alternately and/or periodically repeated. The periodic structure P may be, for example, a wiring pattern formed on a memory cell array of a NAND flash memory. The measurement device 1 irradiates the periodic structure P with a light beam, and measures the diffraction spectrum light generated in the periodic structure P. The measurement device 1 derives a line and space width (hereinafter simply referred to as a width) LS of the periodic structure P by analyzing the diffraction spectrum light as a diffraction signal using a so-called chemometrics method. That is, the measurement device 1 derives the width LS from the diffraction spectrum light by applying a light intensity of each frequency band (wavelength band) of the diffraction spectrum light to a preset calculation formula. It is appreciated that the measurement device 1 may derive either the line width or the space width from the diffraction spectrum light. The chemometrics method will be described later.

The measurement device 1 includes a light source 10, a polarizer 20, an analyzer 30, a prism 40, a detector 50, a calculation unit 60, a controller 70, a model generation unit 80, and a display unit 90 in order to derive a width LS from the diffraction spectrum light. The light source 10 outputs a light beam L under a control of the controller 70. The light beam L is, for example, white light including light in various frequency bands. The polarizer 20 polarizes the light beam L from the light source 10 and irradiates the periodic structure P with the light beam L. The diffraction spectrum light reflected and diffracted by the periodic structure P enters the prism 40 through the analyzer 30. The prism 40 separates the diffraction spectrum light for each frequency band and inputs the diffraction spectrum light to the detector 50. The detector 50 converts the light intensity of each frequency band of the diffraction spectrum light into an electrical signal (diffraction signal) corresponding to the light intensity and sends the signal to the calculation unit 60. The calculation unit 60 derives the width LS of the periodic structure P by applying a diffraction signal of the diffraction spectrum light to the calculation formula. That is, the calculation unit 60 derives the width LS of the periodic structure P from the diffraction signal using the so-called chemometrics method (machine learning method).

The calculation formula is stored in advance in a memory of the calculation unit 60. The calculation formula is a formula which derives the width LS from the diffraction signal of the diffraction spectrum light, and is expressed, for example, as Formula 1.

$$LS=\beta 1\cdot X1+\beta 2\cdot X2+\beta 3\cdot X3+\ldots+b \quad \text{(Formula 1)}$$

Here, X1, X2, X3 . . . indicates the light intensity in each frequency band of the diffraction spectrum light. For example, X1 indicates the light intensity in a frequency band of about 300 nanometers(nm) in wavelength, X2 indicates the light intensity in a frequency band of about 1 micrometer (μm) in wavelength, and X3 indicates the light intensity in a frequency band of about 15 μm in wavelength. β1, β2, β3 . . . are coefficients of X1, X2, X3 . . . , and are numerical values set in advance.

The coefficients β1, β2, β3 . . . can be obtained from the corresponding relationship between the diffraction signal of the diffraction spectrum light and the actual dimension actually measured by the SEM or the like in the model generation unit 80. For example, the model generation unit 80 acquires the diffraction signal of the diffraction spectrum light of the sample structure. Meanwhile, the actual dimension of the same sample structure is measured using the SEM or the like. The diffraction signal and the actual dimension of the sample structure are input to the model generation unit 80. The model generation unit 80 applies the light intensity in each frequency band of the diffraction signal to X1, X2, X3 . . . , and applies the actual dimension to LS. As a result, a formula is obtained, in which β1, β2, β3 . . . are unknown numbers. The model generation unit 80 obtains such formula from a plurality of sample structures, and solves these formulas to obtain β1, β2, β3 . . . . Accordingly, the calculation formula of Formula 1 is obtained.

The model generation unit 80 outputs Formula 1 to the calculation unit 60, and the calculation unit 60 uses the Formula 1 when a target structure is to be measured. At this time, the measurement device 1 obtains the light intensities X1, X2, X3 in each frequency band from the diffraction signals of the diffraction spectrum light of the target structure, and derives the width LS from Formula 1.

The display unit 90 may display various results derived by the model generation unit 80 and/or the calculation unit 60 and show the results to a user.

As described above, in the embodiment, the model generation unit 80 calculates Formula 1 using the diffraction signal of the optically obtained diffraction spectrum light as learning data, and using the actual dimension measured by the SEM or the like as the training data. The measurement device 1 measures (estimates) the actual dimension from the diffraction signal of the target structure using Formula 1 as a prediction model of the dimension value. The model generation unit 80 and/or the calculation unit 60 may be a computer provided inside the measurement device 1, or may be an external computer provided outside the measurement device 1. The display unit 90 may be a display device provided inside the measurement device 1, or may be an external computer which is provided outside the measurement device 1 and is integrated with the model generation unit 80 and/or the calculation unit 60.

In addition, in order to estimate the actual dimension from the diffraction signal with high accuracy using Formula 1, it is preferable that the number of pairs of the training data and the learning data is as large as possible. However, as described above, it is difficult to measure the training data in a non-destructive manner, and it is difficult to acquire a large number of pairs. Therefore, in the measurement method according to the embodiment, before the actual dimension is estimated from the diffraction signal by using Formula 1, the learning data and the training data are interpolated to increase the number of pairs of the learning data and the training data. The pairs of the learning data and the training data are data obtained from the same sample structure. Further, the pattern of the sample structure is formed in substantially the same pattern as the pattern of the target structure to be measured.

FIG. 2 is a flowchart showing an example of the measurement method according to the first embodiment.

First, the measurement device 1 irradiates the sample structure (reference structure) provided on the semiconductor substrate W with the light beam and the diffraction signal of the diffraction spectrum light is acquired (S10). The measurement device 1 acquires diffraction signals (learning data) for a plurality of sample structures S1 to Sn (n is a positive integer) having the same pattern. The diffraction signals of the sample structures S1 to Sn are sent to the model generation unit 80.

Figure 3:
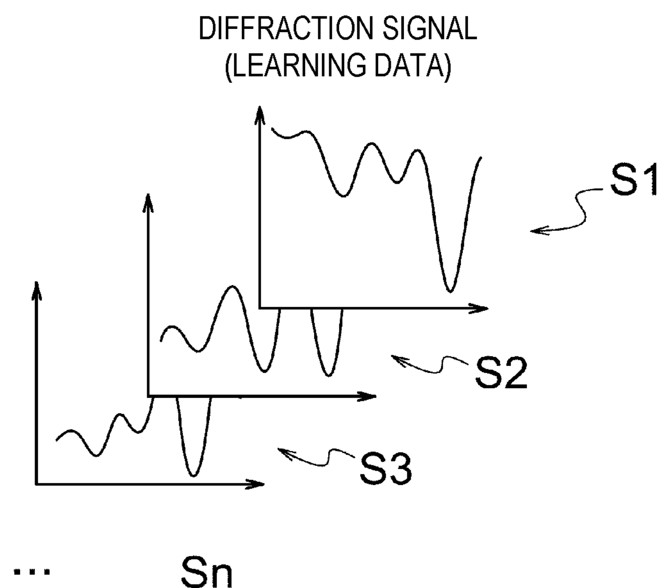
FIG. 3 is a conceptual diagram showing a flow from a diffraction signal to generation of an interpolation learning data map.
Figure 4:
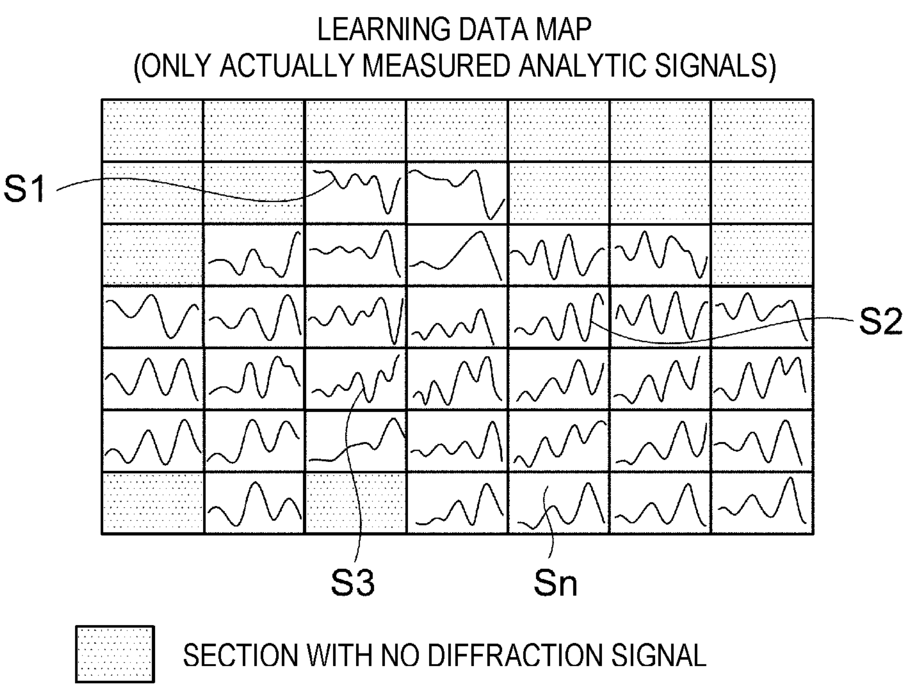
FIG. 4 is a conceptual diagram showing the flow from the diffraction signal to generation of the interpolation learning data map.
Figure 5:
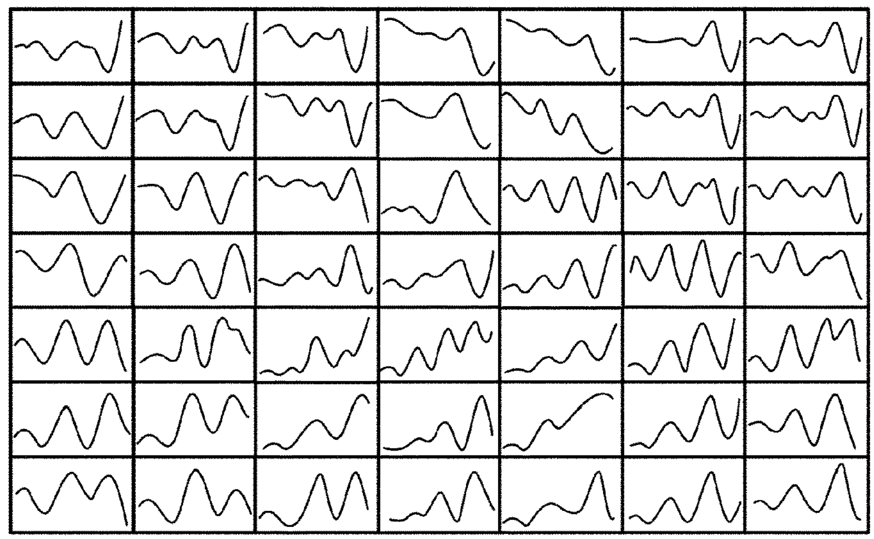
FIG. 5 is a conceptual diagram showing the flow from the diffraction signal to generation of the interpolation learning data map.

Next, the model generation unit 80 classifies the diffraction signals of the sample structures S1 to Sn into a matrix shape based on the similarity, and a learning data map is generated as a first data map. For example, FIG. 3 to FIG. 5 are conceptual diagrams showing a flow from diffraction signals to generation of an interpolation learning data map. The diffraction signals of the sample structures S1 to Sn shown in FIG. 3 are sent to the model generation unit 80 and classified into an SOM (Self-Organizing Map) based on the similarity. The horizontal axis of each graph shown in FIG. 3 indicates the frequency of diffracted light, and the vertical axis indicates the light intensity. As described above, the diffraction signal may be represented as a graph showing the light intensity with respect to the frequency of the diffracted light. The similarity of the diffraction signal is determined based on the light intensity of the diffraction signal. For example, it is determined by the model generation unit 80 that the smaller a mean square error of the light intensity between certain diffraction signals, the higher the similarity of the plurality of diffraction signals thereof.

The SOM classification result is shown in FIG. 4. Similar diffraction signals are disposed in closer sections, and dissimilar diffraction signals are disposed in farther sections. For example, the sample structures S1 to Sn of the diffraction signals of FIG. 3 are SOM classified as shown in FIG. 4. However, at this stage, the number of samples is limited, and there are many sections with no diffraction signal (first interpolation target point).

Next, the model generation unit 80 interpolates data between the diffraction signals using the diffraction signals in the learning data map and generates an interpolation learning data map as the first interpolation data map (S20). At this time, the model generation unit 80 may generate the interpolation learning data map by self-organizing map (SOM) creation and the SOM classification. That is, the interpolation learning data map is generated by generating the SOM and a cluster average data based on the input diffraction signals (SOM creation), and classifying each diffraction signal of the SOM and the cluster average data according to similarity. An example of the interpolation learning data map is shown in FIG. 5. As shown in FIG. 5, sections with no diffraction signal in FIG. 4 are interpolated by the SOM creation. Accordingly, the interpolation target point missing in the learning data map is interpolated by the cluster average data according to the SOM creation using the diffraction signals in the learning data map. The data interpolated to the interpolation target point of the learning data map (first interpolation data) is not a diffraction signal measured by the measurement device 1, but is so-called data generated by the SOM creation, so that similarity with the surrounding diffraction signal thereof is high. The way of cutting grids in the SOM includes, for example, a lattice shape, a honeycomb shape, a three-dimensional lattice shape, and the like. In the SOM classification, similar data is classified into closer sections. Therefore, in the section where the diffraction signal is classified and a section adjacent to the section, the cluster average data similar to the diffraction signal is provided. Accordingly, the interpolation learning data map is obtained.

Figure 6:
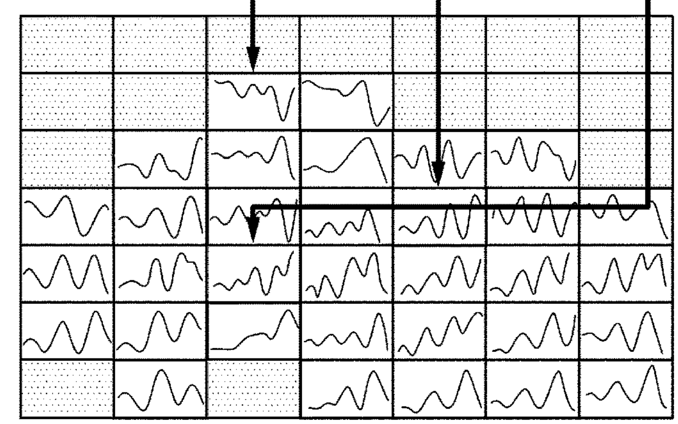
FIG. 6 is a conceptual diagram showing a flow from an actual dimension of a sample structure to generation of an interpolation training data map.

Next, an actual dimension of each sample structure (training data) is acquired using the SEM or the like (S30). For example, FIG. 6 to FIG. 8 are conceptual diagrams showing a flow from the actual dimensions of the sample structures to generation of an interpolation training data map. The actual dimension is measured using an electron microscope such as SEM after cleaving the real sample structures S1 to Sn. Accordingly, the actual dimension of each of the sample structures S1 to Sn is obtained. In FIG. 6, the actual dimensions of the sample structures S1, S2, and S3 are about 5.5 nm, about 4.8 nm, and about 4.6 nm. The actual dimensions of the sample structures S1 to Sn are input to the model generation unit 80.

Next, the model generation unit 80 arranges the actual dimensions of the sample structures S1 to Sn to correspond to the diffraction signals of the learning data map, and generates the training data map as the second data map (S40). The actual dimension of the sample structure S1 is associated with the diffraction signal corresponding to a section of the sample structure S1 in the learning data map, and is provided in a certain section of the diffraction signal of the sample structure S1. Similarly, the actual dimensions of the sample structures S2 to Sn are associated with the diffraction signals corresponding to each section of the sample structures S2 to Sn in the learning data map, and are provided in certain sections with the diffraction signals of the sample structures S2 to Sn. As a result, as shown in FIG. 7, the training data map is generated. That is, each actual dimension section of the training data map corresponds to a section of the diffraction signal of the learning data map of the same sample structure. Therefore, there is no actual dimension data in the section of the training data map corresponding to the section with no diffraction signal in the learning data map (first interpolation target point). Therefore, at this stage, the number of samples (the number of pairs of the diffraction signal and the actual dimension) is limited, and there are many sections with no actual dimension (second interpolation target points).

Next, the model generation unit 80 generates the interpolation training data map as the second interpolation data map by interpolating data between the actual dimensions using the actual dimensions in the training data map (S50). The interpolation target point missing in the training data map is interpolated by data (second interpolation data) obtained by calculating the actual dimension around the interpolation target point. Accordingly, the interpolation training data map is generated as shown in FIG. 8. The interpolation processing method of the training data map will be described with reference to FIG. 9 to FIG. 12.

FIG. 9 to FIG. 12 are conceptual diagrams showing the interpolation processing method of the training data map. Numerical value in parentheses shown in FIG. 9 indicates the number of pieces of the actual dimension data adjacent to the interpolation target point. The number of pieces of the actual dimension data adjacent to the interpolation target point (hereinafter, also referred to as the number of adjacent data pieces) is a numerical value of any one of 0 to 8. For example, five actual dimension data pieces are adjacent to the periphery of an interpolation target point I1. Therefore, the number of data pieces adjacent to the interpolation target point I1 is 5, and the numerical value in the parentheses for the interpolation target point I1 is 5. Four actual dimension data pieces are adjacent to the periphery of an interpolation target point 12. Therefore, the number of data pieces adjacent to the interpolation target point I2 is 4, and the numerical value in the parentheses for the interpolation target point I2 is 4. Three actual dimension data pieces are adjacent to the periphery of the interpolation target point I3. Therefore, the number of data pieces adjacent to the interpolation target point I3 is 3, and data in the parentheses for the interpolation target point I3 is 3.

According to the embodiment, the interpolation processing of the interpolation target point is executed using the actual dimensions adjacent to the interpolation target point. Therefore, as the number of the actual dimensions adjacent to the interpolation target point increases, the interpolation target point can be interpolated with a more accurate dimension value. For example, the interpolation target point I1 may be interpolated using five actual dimensions. The interpolation target point I2 may be interpolated using four actual dimensions. The interpolation target point I3 may be interpolated using three actual dimensions. Accordingly, I2 can be interpolated with more accurate dimensional values than I3. Also, I1 can be interpolated with a more accurate dimension value than I2.

Figure 10A:
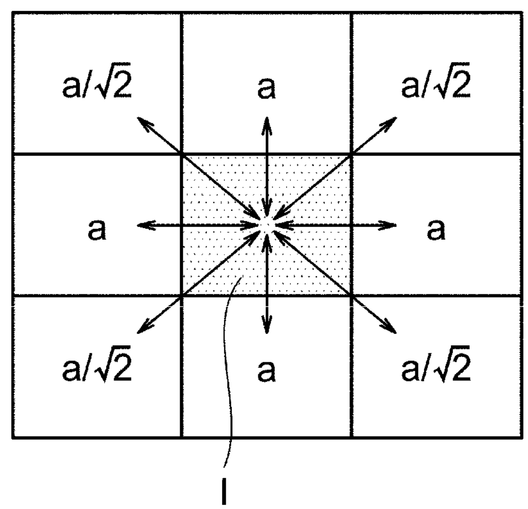
FIG. 10A is a conceptual diagram showing the interpolation processing method of the training data map.
Figure 10B:
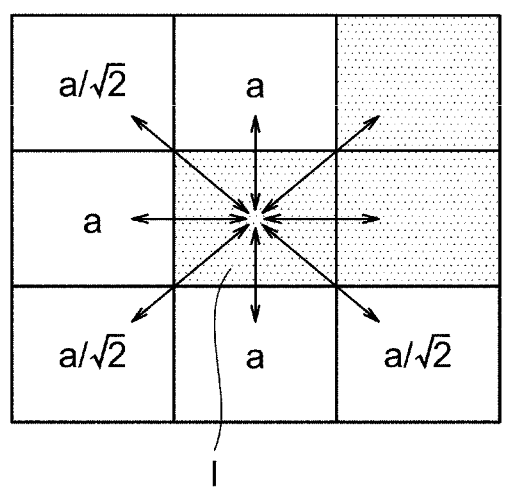
FIG. 10B is a conceptual diagram showing the interpolation processing method of the training data map.

FIG. 10A and FIG. 10B are conceptual diagrams showing a method of calculating interpolation training data to be interpolated to the interpolation target point. The interpolation training data, which can serve as the second interpolation data, is calculated by multiplying the actual dimension by a weighting according to a distance from the interpolation target point to the actual dimension on the training data map. For example, each section of the training data map is set to be square, and a length of one side thereof is set to d. In this case, a distance between the interpolation target point I and eight adjacent sections on a periphery thereof is d or $\sqrt{2}$d. Distances between the interpolation target point I and four sections adjacent to the interpolation target point I in a vertical direction or a horizontal direction are d separately. Distances between the interpolation target point I and four sections diagonally adjacent to the interpolation target point I are $\sqrt{2}$d separately. The weighting is determined to be inversely proportional to a distance from the interpolation target point I to the actual dimension. For example, a weighting of the four sections adjacent to the interpolation target point I in the vertical direction or the horizontal direction is set to a. In this case, a weighting of the four sections diagonally adjacent to the interpolation target point I is $a/\sqrt{2}$. In this case, a sum of the weighting of the eight sections is determined to be 1. In the case of FIG. 10A, $(4+4/\sqrt{2})$ a=1, so that $a=1/(4+4/\sqrt{2})$.

Here, a is also determined by the number of actual dimensions adjacent to the interpolation target point. For example, as shown in FIG. 10B, when there is no actual dimension on a diagonally upper right section and a right section of the interpolation target point, a sum of weighting of remaining six sections is determined to be 1. In the case of FIG. 10B, $(3+3/\sqrt{2})$ a=1, so that $a=1/(3+3/\sqrt{2})$.

Further, the interpolation processing is executed firstly from an interpolation target point where the number of adjacent data pieces is large. For example, the interpolation target points I1 to 13 in FIG. 9 may be interpolated in the order of I1, I2, and I3. In a case where a plurality of interpolation target points have the same number of adjacent data pieces, for example, the interpolation processing may be executed in order from the left column of the training data map. Further, in a case where there are a plurality of interpolation target points having the same number of adjacent data pieces on the same column of the training data map, the interpolation processing may be executed in order from the top of the training data map. The order of the interpolation processing in the case of having the same number of adjacent data pieces is not limited to the above, and may be changed as desired.

FIG. 11 is a training data map after the interpolation of the interpolation target points I1 to I3.

The interpolation target point I1 is interpolated using five actual dimension data pieces (3.1, 8.1, 7.4, 3.9, 5.4) adjacent to the periphery of the interpolation target point I1. Specifically, $I1=(3.1+8.1+7.4+3.9+3.9/\sqrt{2}+5.4/\sqrt{2})/(3+\sqrt{2})=5.7$.

The interpolation target point I2 is interpolated using five actual dimension data pieces (6.3, 3.9, 3.9, 3.6) adjacent to the periphery of the interpolation target point I2. Specifically, $I2=(6.3+3.9+3.9/\sqrt{2}+3.6/\sqrt{2})/(2+\sqrt{2})=4.5$.

The interpolation target point I3 is interpolated using three actual dimension data pieces (3.9, 3.8, 3.9) adjacent to the periphery of the interpolation target point I3. Specifically, $I3=(3.9+3.8+3.9/\sqrt{2})/(2+1/\sqrt{2})=3.9$. In addition to the interpolation target point I3, there are three other interpolation target points with three adjacent data pieces. However, since the interpolation target point I3 is located at an uppermost stage of the left column, I3 is firstly interpolated among the interpolation target points with three adjacent data pieces.

FIG. 12 is a training data map after interpolation of the interpolation target points I4 to I6 following FIG. 11. The interpolation target points I4 to I6 are interpolated in order next to the interpolation target point I3.

The interpolation target point I4 is interpolated using three actual dimension data pieces (3.1, 3.1, 3.9) adjacent to a periphery thereof. Specifically, $I4=(3.1+3.1+3.9/\sqrt{2})/(2+1/\sqrt{2})=5.7$.

The interpolation target point I5 is interpolated using three actual dimension data pieces (3.8, 5.5, 3.9) adjacent to the periphery thereof and I3 (3.9) which has already been interpolated. Specifically, $I5=(3.8+5.5+3.9/\sqrt{2}+3.9/\sqrt{2})/(2+\sqrt{2})=4.5$. As described above, when the adjacent interpolation target points have already been interpolated, the model generation unit 80 continues the interpolation processing using the interpolated data (interpolation training data).

The interpolation target point I6 is interpolated using three actual dimension data pieces (3.6, 2.9, 3.6) adjacent to the periphery thereof. Specifically, $I6=(3.6+2.9+3.6/\sqrt{2})/(2+1/\sqrt{2})=3.3$.

FIG. 13 is a diagram showing the training data map after interpolation of the interpolation target points I7 to I8 following FIG. 12. The interpolation target points I7 to I8 are interpolated in order next to the interpolation target point I6.

The interpolation target point I7 is interpolated using two actual dimension data pieces (5.5, 6.3) adjacent to a periphery thereof and I5 (4.3) which has already been interpolated. Specifically, $I7=(5.5+4.3/\sqrt{2}+6.3/\sqrt{2})/(1+\sqrt{2})=5.4$.

The interpolation target point I8 is interpolated using two actual dimension data pieces (5.5, 6.3) adjacent to the periphery thereof and I2 and I7 (4.5, 5.4) which have already been interpolated. Specifically, $I8=(5.4+6.3+5.5/\sqrt{2}+4.5/\sqrt{2})/(2+\sqrt{2})=5.5$.

The interpolation target point I9 is interpolated using two actual dimension data pieces (3.9, 3.6) adjacent to the periphery thereof and I2 and I6 (4.5, 3.3) which have already been interpolated. Specifically, $I9=(3.6+4.5+3.9/\sqrt{2}+3.3/\sqrt{2})/(2+\sqrt{2})=3.9$.

Further, the model generation unit 80 similarly interpolates the interpolation target points I10 to I16 with one or zero adjacent data pieces. As a result, an interpolation training data map shown in FIG. 14 is generated. FIG. 14 is a diagram showing the interpolation training data map.

Next, the model generation unit 80 derives a calculation formula (Formula 1) by which the actual dimension is obtained from the diffraction signal using the interpolation learning data map and the interpolation training data map (S60). Formula 1 is a calculation formula by which the actual dimension of the target structure is obtained from the signal intensity in each frequency band of the diffraction signal obtained from the target structure to be measured, and is obtained by calculating the coefficients β1, β2, β3 . . . . That is, Formula 1 may be referred to as a conversion formula which converts the diffraction signal into the actual dimension of the target structure. The coefficients β1, β2, β3 . . . are coefficients which are used to convert the diffraction signal into the actual dimension of the target structure, and are values which multiply the signal intensity of each frequency band of the diffraction signal.

The model generation unit 80 puts the actual dimensions or interpolation training data of the interpolation training data map in LS of Formula 1, and puts the diffraction signal of the interpolation learning data map and the light intensity of each frequency band of the interpolation learning data map in X1, X2, X3 . . . . A formula of the coefficients β1, β2, β3 . . . is generated using pairs of the actual dimensions (or interpolation training data) and the diffraction signals (or interpolation learning data) corresponding to each other, and the coefficients β1, β2, β3 . . . are obtained when the formula is solved. The numerical values of β1, β2, β3 . . . are applied to Formula 1, and thus a calculation formula which converts the diffraction signal into the actual dimension of the target structure is generated.

Here, the interpolation learning data map and the interpolation training data map include not only the actual dimensions and the diffraction signals actually obtained from the sample structures but also the interpolation learning data and the interpolation training data. Therefore, the interpolation learning data map and the interpolation training data map include pairs of more actual dimensions (or interpolation training data) and diffraction signals (or interpolation learning data). Accordingly, the model generation unit 80 can calculate more accurate coefficients β1, β2, β3 . . . .

The coefficients β1, β2, β3 . . . calculated in this way are applied to Formula 1, then, the formula is stored in the calculation unit 60 of the measurement device 1. The calculation unit 60 measures the diffraction signal of the target structure and applies the light intensity of each frequency band to X1, X2, X3 . . . of Formula 1 to calculate LS (S70). The LS is stored as the dimension of the target structure or is output to the outside. In this way, the measurement device 1 can optically measure (estimate) the dimension of the target structure with high accuracy.

For example, the learning data map (first data map), the interpolation learning data map (first interpolation data map), the training data map (second data map), and the interpolation training data map (second interpolation data map) may be displayed on the display unit 90 during processing. In this way, the user can confirm the progress of the processing of the measurement device 1, and can evaluate validity of a measurement (estimation) result.

Second Embodiment

The interpolation learning data map and the interpolation training data map may be used as a whole in order to derive Formula 1. However, in the second embodiment, interpolation training data with the number of adjacent data pieces equal to or less than a threshold value, among the training data map and interpolation learning data corresponding thereto, are not used for the derivation of Formula 1. That is, interpolation learning data and interpolation training data having low relevance to the diffraction signals and the actual dimensions directly obtained from the sample structures are not used for the calculation of coefficients β1, β2, β3 . . . of Formula 1. The threshold value may be set in advance and stored in the memory in the model generation unit 80.

For example, in step S50, the interpolation training data is not interpolated at an interpolation target point with the number of adjacent data pieces equal to or less than 1 among the training data map shown in FIG. 9. Alternatively, in step S60, among the training data map shown in FIG. 9, interpolation training data with the number of adjacent data pieces equal to or less than 1 and interpolation learning data corresponding thereto are not used for the derivation of Formula 1. The interpolation learning data with the number of adjacent data pieces equal to or less than 1 and the interpolation learning data corresponding thereto have low relevance to the actual dimensions of the actual sample structures and the diffraction signals. Accordingly, by eliminating the interpolation training data and the interpolation learning data having low relevance to the actual dimensions and the diffraction signals, Formula 1 can be derived using the interpolation training data and the interpolation learning data with high similarity to the actual dimensions and the diffraction signals. Accordingly, Formula 1 has high accuracy. As a result, the measurement device 1 can calculate a more accurate actual dimension with respect to the diffraction signal of the target structure.

FIG. 15 is a conceptual diagram showing the interpolation training data map according to the second embodiment. In FIG. 15, the interpolation training data with the number of adjacent data pieces equal to or less than 1 is not generated. Accordingly, the accuracy of Formula 1 can be improved. In addition, a load of the model generation unit 80 can be reduced.

At least a part of the measurement method and device according to the embodiment may be implemented by hardware or software. As for hardware, it may be a circuit (e.g., circuitry of a CPU, GPU, FPGA or other processing circuits implemented using electronic circuits) , or a processor (e.g., CPU, GPU and the like) with a memory configured to implement the identified components herein. When software is used, a program which achieves at least some of functions of the measurement method is stored in a recording medium such as a flexible disk, CD-ROM, ROM, RAM, flash memory, DVD-ROM, Blu-Ray® discs, and may be read and executed by a computer. The recording medium is not limited to a removable recording medium such as a magnetic disk or an optical disk, and may also be a fixed type recording medium such as a hard disk device or a memory. Further, the program which achieves at least some of the functions of the measurement method may be distributed via a communication line (including wireless communication) such as the Internet or the like. Still further, the program may be distributed via a wired line or a wireless line such as the Internet or distributed after being stored in a state where the same program is encrypted, modulated, or compressed.

While some embodiments of the present invention were described, these embodiments are presented only as examples, and are not intended to limit the scope of the present invention. These embodiments may be carried out in various other forms, and various omissions, replacements and modifications may be made thereto without departing from the scope of the present disclosure. These embodiments and modifications thereof fall within the scope of the invention or the gist thereof, and fall within a scope equivalent to the invention described in the claims.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A measurement method, comprising:

acquiring a diffraction signal of each of a plurality of reference structures;

classifying the diffraction signals based on a similarity to generate a first data map;

interpolating data between the diffraction signals using the diffraction signals in the first data map to generate a first interpolation data map;

measuring an actual dimension of each of the plurality of reference structures;

arranging the actual dimensions to correspond to the diffraction signals of the first data map to generate a second data map;

interpolating data between the actual dimensions using the actual dimensions in the second data map to generate a second interpolation data map; and deriving a calculation formula using the first interpolation data map and the second interpolation data map;

wherein the similarity of the diffraction signals is determined based on light intensity of the diffraction signal; and wherein it is determined that the smaller a mean square error of the light intensities between the plurality of diffraction signals represents a greater similarity of the plurality of diffraction signals.

2. The measurement method according to claim 1, further comprising:

identifying a first interpolation target point missing in the first data map; and interpolating the first interpolation target point using the diffraction signals in the first data map based on self-organizing map creation.

3. The measurement method according to claim 1, further comprising:

identifying a second interpolation target point missing in the second data map; and interpolating the second interpolation target point using one or more of the actual dimensions on a periphery of the second interpolation target point.

4. A measurement method, comprising:

acquiring a diffraction signal of each of a plurality of reference structures;

classifying the diffraction signals based on a similarity to generate a first data map;

interpolating data between the diffraction signals using the diffraction signals in the first data map to generate a first interpolation data map;

measuring an actual dimension of each of the plurality of reference structures;

arranging the actual dimensions to correspond to the diffraction signals of the first data map to generate a second data map;

interpolating data between the actual dimensions using the actual dimensions in the second data map to generate a second interpolation data map;

deriving a calculation formula using the first interpolation data map and the second interpolation data map;

identifying a second interpolation target point missing in the second data map; and interpolating the second interpolation target point using one or more of the actual dimensions on a periphery of the second interpolation target point, wherein interpolating the second interpolation target point further comprises multiplying each of the one or more actual dimensions by a respective weighting according to a distance from the second interpolation target point to the actual dimension in the second data map.

5. A measurement method, comprising:

acquiring a diffraction signal of each of a plurality of reference structures;

classifying the diffraction signals based on a similarity to generate a first data map;

interpolating data between the diffraction signals using the diffraction signals in the first data map to generate a first interpolation data map;

measuring an actual dimension of each of the plurality of reference structures;

arranging the actual dimensions to correspond to the diffraction signals of the first data map to generate a second data map;

interpolating data between the actual dimensions using the actual dimensions in the second data map to generate a second interpolation data map; and deriving a calculation formula using the first interpolation data map and the second interpolation data map, wherein the calculation formula is a calculation formula which is used to obtain an actual dimension of the target structure from a signal intensity in each frequency band of the diffraction signal obtained from a target structure to be measured, and the calculation formula is derived by calculating a coefficient, to be multiplied by the signal intensity in each frequency band of the diffraction signal, using the first interpolation data map and the second interpolation data map.

6. A measurement method, comprising:

acquiring a diffraction signal of each of a plurality of reference structures;

classifying the diffraction signals based on a similarity to generate a first data map;

interpolating data between the diffraction signals using the diffraction signals in the first data map to generate a first interpolation data map;

measuring an actual dimension of each of the plurality of reference structures;

arranging the actual dimensions to correspond to the diffraction signals of the first data map to generate a second data map;

interpolating data between the actual dimensions using the actual dimensions in the second data map to generate a second interpolation data map;

deriving a calculation formula using the first interpolation data map and the second interpolation data map;

identifying a second interpolation target point missing in the second data map; and interpolating the second interpolation target point using one or more of the actual dimensions on a periphery of the second interpolation target point, wherein in a case where the number of actual dimensions adjacent to the second interpolation data is less than a predetermined value on the second data map, the second interpolation data is not used to derive the calculation formula.

7. A measurement method, comprising:

generating a learning data map using a plurality of diffraction signals respectively provided by a plurality of reference structures;

generating an interpolation learning data map by interpolating the plurality of diffraction signals;

generating a training data map using by associating a plurality of actual dimensions to the plurality diffraction signals;

generating an interpolation teach data map based on the plurality of actual dimensions;

deriving a calculation formula using the interpolation learning data map and the interpolation training data map; and measuring a width of a periodic structure using the calculation formula;

wherein generating an interpolation teach data map further comprises:

identifying a section in the teach data map that lacks an actual dimension; and interpolating the section using one or more of the actual dimensions on a periphery of the section, wherein interpolating the section further comprises multiplying each of the one or more actual dimensions by a respective weighting according to a distance from the section to the actual dimension in the training data map.

8. The measurement method according to claim 7, wherein generating an interpolation learning data map further comprises:

identifying a section in the learning data map that lacks a diffraction signal; and interpolating the section using the diffraction signals in the learning data map based on self-organizing map creation.

9. A measurement method, comprising:

generating a learning data map using a plurality of diffraction signals respectively provided by a plurality of reference structures;

generating an interpolation learning data map by interpolating the plurality of diffraction signals;

generating a training data map using by associating a plurality of actual dimensions to the plurality diffraction signals;

generating an interpolation teach data map based on the plurality of actual dimensions;

deriving a calculation formula using the interpolation learning data map and the interpolation training data map;

measuring a width of a periodic structure using the calculation formula;

determining that the number of actual dimensions peripheral to the section on the teach data map is less than a predetermined value; and excluding the section from the derivation of the calculation formula, wherein generating an interpolation teach data map further comprises:

identifying a section in the teach data map that lacks an actual dimension; and interpolating the section using one or more of the actual dimensions on a periphery of the section.

10. A system comprising:

one or more hardware processors configured by machine-readable instructions to:

generate a learning data map using a plurality of diffraction signals respectively provided by a plurality of reference structures;

generate an interpolation learning data map by interpolating the plurality of diffraction signals;

generate a training data map using by associating a plurality of actual dimensions to the plurality diffraction signals;

generate an interpolation teach data map based on the plurality of actual dimensions by identifying a section in the teach data map that lacks an actual dimension, and by interpolating the section using one or more of the actual dimensions on a periphery of the section, wherein interpolating the section further comprises multiplying each of the one or more actual dimensions by a respective weighting according to a distance from the section to the actual dimension in the training data map;

derive a calculation formula using the interpolation learning data map and the interpolation training data map; and measure a width of a periodic structure using the calculation formula.

* * * * *